United States Patent
Li et al.

(10) Patent No.: US 8,229,376 B2
(45) Date of Patent: *Jul. 24, 2012

(54) COMPENSATION METHOD OF RADIO FREQUENCY MODULE PERFORMANCE AND RADIO FREQUENCY MODULE

(75) Inventors: Chengsheng Li, Shenzhen (CN); Yali Wang, Shenzhen (CN); Limeng Xiao, Shenzhen (CN)

(73) Assignee: Shenzhen Grentech Co. Ltd., Shenzhen (CN)

( * ) Notice: Subject to any disclaimer, the term of this patent is extended or adjusted under 35 U.S.C. 154(b) by 170 days.

This patent is subject to a terminal disclaimer.

(21) Appl. No.: 12/738,642

(22) PCT Filed: Jul. 1, 2008

(86) PCT No.: PCT/CN2008/071496
§ 371 (c)(1),
(2), (4) Date: Apr. 19, 2010

(87) PCT Pub. No.: WO2009/049506
PCT Pub. Date: Apr. 23, 2009

(65) Prior Publication Data
US 2010/0210231 A1  Aug. 19, 2010

(30) Foreign Application Priority Data
Oct. 19, 2007  (CN) .............................. 2007 1 012368

(51) Int. Cl.
*H01Q 11/12* (2006.01)
*H04B 1/04* (2006.01)

(52) U.S. Cl. ................. 455/127.2; 455/67.11; 455/115.1
(58) Field of Classification Search .............. 455/67.11, 455/115.1, 226.1, 7, 11.1, 561, 127.1, 127.2; 375/296, 297
See application file for complete search history.

(56) References Cited

U.S. PATENT DOCUMENTS

| | | | |
|---|---|---|---|
| 6,452,454 B1 * | 9/2002 | Shapiro et al. | 330/289 |
| 2004/0142668 A1 * | 7/2004 | Ge | 455/127.1 |

* cited by examiner

*Primary Examiner* — Quochien B Vuong

(57) ABSTRACT

A compensation method for radio frequency module performance, said radio frequency module is provided with a radio frequency input power detection circuit, a radio frequency output power detection circuit, a module monitoring circuit, a power amplification circuit and a radio frequency digital controlled attenuator. The soft program running in the processor of the module monitoring circuit adjusts parameters of the radio frequency module according to querying predefined compensation table or according to the compensation data calculated based on predefined formula/algorithm, thus reducing influence of ambient temperature to linearity, gain, radio frequency power detection accuracy of the radio frequency module, as well as avoiding gain decrease of the radio frequency module. Moreover, a radio frequency module improved by such method is also provided. As said structure of above mentioned method is employed by the radio frequency module, monitoring method according to this structure is able to automatically debugging and testing by using tools such as computer, thus improving the production efficiency.

11 Claims, 6 Drawing Sheets

COMPENSATION METHOD OF RADIO
FREQUENCY MODULE PERFORMANCE
AND RADIO FREQUENCY MODULE

FIELD OF THE INVENTION

The present invention relates to performance optimization for a radio frequency module in a field of communication, more specifically, relates to a method for compensating gain of a radio frequency module and adjusting linearity of a radio frequency module, as well as the radio frequency module improved by such method.

BACKGROUND OF THE INVENTION

As an important component of a communication system, such as a base station and a repeater station, stability of a radio frequency module directly affects stability of the whole communication system. With the rapid development of communication industry, demand for such stability is increasing. Especially in 3G era, for pursuing higher data rate and spectrum efficiency, linear modulation methods (e.g. QPSK, 16QAM, etc.) are generally employed, and radio frequency modules with higher linearity reliability are needed by such modulation methods. The existing radio frequency modules have defects such as poor gain stability and linearity changeable with temperature due to various reasons.

FIG. 1 is a structural diagram of an existing radio frequency module. As shown in the figure, the radio frequency module comprises a signal input end 11, a power amplification circuit 12, a hardware compensation circuit 13, a monitoring signal line 14, a signal output end 15, a monitoring port 16, a monitoring signal line 17 and a radio frequency shielding housing 19.

Above mentioned existing radio frequency module has following defects:

1. Radio frequency module was designed according to a certain quota of gain and output power, when performance of the power amplifier declines, gain of the radio frequency module declines and output power of the radio frequency module becomes insufficient. Such phenomenon is one of the common problems in current communication devices. Such problem results in unrecoverable decline in performance index of the radio frequency module and the severe ones even result in abnormal operation of the whole communication equipment.

2. Hardware compensation circuit 13 of the radio frequency module uses hardware compensation, that is, uses temperature characteristics of the electronic components themselves for the compensation. Hardware compensation is mainly adjusting gate voltage of the power amplifier. The content of the compensation comprise gain and linearity of the radio frequency module. In practical operations, due to the differences in temperature characteristics among each power amplifiers, as well as differences in temperature characteristics within each electronic component itself, accuracy and reliability of compensated gain and linearity will be lower. Meanwhile, as the gain and linearity are realized by adjusting gate voltage of the power amplifier, in the case of being unable to take both into account, gain compensation and linearity compensation can not meet the need of the radio frequency module in certain extend. For example, gain and linearity compensation circuit in hardware compensation circuit 13 uses hardware compensation, when temperature characteristics of electronic components used in the hardware compensation can not perfectly match characteristics of the power amplifier needed to be compensated, phenomenon of gain and linearity compensation error will present at different temperatures.

3. Parts, in need of circuit compensation, of detection signal and control signal in power amplification circuit of the radio frequency module also commonly use hardware compensation method. For example, downlink output power detection of link in the radio frequency module uses commonly used radio frequency demodulation device, when demodulation curve of the frequency demodulation device differs from compensation curve of demodulation compensation device, phenomenon of inaccuracy downlink output power presents. In practical operations, demodulation curve of the frequency demodulation device often differs from compensation curve of demodulation compensation device, which results in that power detection accuracy for current radio frequency module is not very high with a general error of $\pm 2$ dB. When compensation curve seriously differs from demodulation curve, detected error even reaches up to $\pm 5$ dB.

4. As shown in FIG. 1, monitoring semaphore of current radio frequency module is directly connected out of control circuit/detection circuit of the module, and gathered to monitoring port 16. Since these monitoring signals are signals of TTL, CMOS or analog that easy to interfere with each other or be interfered by environment, thus influence the performance of radio frequency module.

From these defects existing in prior art, we can see that it is necessary to design a novel compensation method for radio frequency module performance, as well as corresponding radio frequency module, so as to improve accuracy, reliability and anti-interference ability of gain compensation.

SUMMARY OF THE INVENTION

The objective of this invention is to provide a compensation method for radio frequency module performance, and a radio frequency module improved by such method, so as to improve product performance of the radio frequency module, thereby increasing compensation accuracy in the radio frequency module, as well as adjusting linearity, reliability and anti-interference ability of the radio frequency module.

Technical solution employed in the present invention for solving above technical problems is: constructing a compensation method for radio frequency module performance, said radio frequency module is provided with a radio frequency input power detection circuit, a radio frequency output power detection circuit, a module monitoring circuit, a power amplification circuit and a radio frequency digital controlled attenuator, and said method comprises:

S1: The soft program running in a processor of said module monitoring circuit queries a predefined linearity compensation table or calculates according to a predefined formula/algorithm according to the collected temperature data to obtain a linearity compensation data, which is sent to said power amplification circuit after being converted to a corresponding control voltage by digital-analog conversion, so as to control linearity of said radio frequency module;

S2: The program running in the processor of said module monitoring circuit queries a predefined power compensation table or calculates based on a predefined formula/algorithm according to the collected temperature data to obtain a power compensation value, which is added to currently detected power detection value, so as to obtain a corrected power detection value;

S3: The program running in the processor of said module monitoring circuit compares difference value of radio frequency output power and radio frequency input power with a pre-saved gain value according to the collected radio frequency output power value and radio frequency input power value, so as to adjust said radio frequency digital controlled attenuator based on the comparison result.

Furthermore, said step S1 further comprises:

S11: After said radio frequency module starts up, a pre-installed program in the processor of said module monitoring circuit runs all the initial values;

S12: Said processor runs the program, detects internal temperature of said radio frequency module in real-time and obtains current temperature;

S13: According to the obtained temperature, queries the linearity compensation table pre-saved in the program or calculates based on the formula/algorithm saved in the program, and obtains a corresponding compensation value;

S14: Outputs the obtained compensation value to a digital-analog convertor of the power amplification circuit, and converts the compensation value to a corresponding voltage value;

S15: Sends the obtained voltage value to the gate of a radio frequency power amplifier of said power amplification circuit, so as to adjust linearity of said radio frequency module.

Furthermore, said step S2 further comprises:

S21: After said radio frequency module starts up, a pre-installed program in the processor of said module monitoring circuit runs all the initial values;

S22: Said processor runs the program, detects internal temperature of said radio frequency module in real-time and obtains a current temperature;

S23: According to the obtained temperature, queries the power compensation table pre-saved in the program or calculates based on the formula/algorithm saved in the program, and obtains a corresponding power compensation value;

S24: Adds the obtained power compensation value to the currently detected power detection value, so as to obtain a corrected power detection value.

Furthermore, said step S3 further comprises:

S31: After said radio frequency module starts up, a pre-installed program in the processor of said module monitoring circuit runs all the initial values;

S32: Said processor runs program, detects radio frequency output power and radio frequency input power of said radio frequency module in real-time and calculates difference value between radio frequency output power and radio frequency input power, the calculated difference value is gain of the radio frequency module;

S33: Compares the obtained gain value with the gain value pre-saved in the program, the obtained difference value is a corresponding gain compensation data;

D34: Outputs the obtained gain compensation data to the radio frequency digital controlled attenuator, so as to adjust the gain of said radio frequency module.

Technical solution employed in the present invention for solving above technical problems is: constructing a radio frequency module, comprising a radio frequency shielding housing, wherein, a power amplification circuit and a compensation circuit connected in series and in turn in a signal host link are arranged inside said radio frequency shielding housing, a monitoring port of said radio frequency module is arranged outside said radio frequency shielding housing, said compensation circuit comprises a radio frequency digital controlled attenuator; a module monitoring circuit, as well as a radio frequency input power detection circuit and a radio frequency output power detection circuit connected in series and in turn with said power amplification circuit and radio frequency digital controlled attenuator on the signal host link are also arranged inside said radio frequency shielding housing, said module monitoring circuit is connected with the radio frequency input power detection circuit, the power amplification circuit, the radio frequency digital controlled attenuator and the radio frequency output power detection circuit respectively through monitoring signal lines, the module monitoring circuit is also connected with the monitoring port through a RS-485 bus.

Furthermore, said module monitoring circuit comprises a processor, a crystal oscillator, a RS-485 convertor, a third analog-digital convertor and a temperature sensor, wherein said crystal oscillator is connected with the reference clock pin of the processor, said RS-485 convertor is connected with the receiving/transmitting signal line of the processor, the output part of the third analog-digital convertor is connected with the processor, and the input part of the third analog-digital convertor is connected with the temperature sensor.

Furthermore, said radio frequency input power detection circuit comprises a first directional coupler, a low power amplifier, a first isolator, a first demodulation device and a first analog-digital convertor, wherein main signal input end of said first directional coupler is connected with the input end of the radio frequency module, main signal output end of the first directional coupler is connected with the power amplification circuit, a signal end coupled from the first directional coupler is connected with the input end of the low power amplifier, the output end of the low power amplifier is connected with the input end of the first demodulation device, the output end of the first demodulation device is connected with the input end of the first analog-digital convertor through the first isolator, the output end of the first analog-digital convertor is connected with the processor.

Furthermore, said radio frequency output power detection circuit comprises a second directional coupler, a second analog-digital convertor, a second isolator and a second demodulation device, the main signal input end of the second directional coupler is connected with the radio frequency digital controlled attenuator, the main signal output end of the second directional coupler is connected with the output end of the radio frequency module, a certain proportion of radio frequency signal is coupled from the main signal link by the second directional coupler, the coupled signal end of the second directional coupler is connected with the input end of the second demodulation device, the output end of the second demodulation device is connected with the input end of the second analog-digital convertor through the second isolator, the output end of the second analog-digital convertor is connected with the processor.

Furthermore, the control part of said radio frequency digital controlled attenuator is connected with the processor of the module monitoring circuit, the signal input end of the radio frequency digital controlled attenuator is connected with the output end of the power amplification circuit, and the signal output end of the radio frequency digital controlled attenuator is connected with the radio frequency output power detection circuit.

Furthermore, the monitoring port of said radio frequency module comprises a data connector for connecting monitoring signal of the module monitoring circuit to peripheral control device of said radio frequency module, and said data connector is connected with the RS-485 bus outputted from the module monitoring circuit.

The compensation method for radio frequency module performance and the radio frequency module provided by the present invention mainly employ a software/hardware combination method of controllable software/hardware compensation circuit and module monitoring circuit for replacing a pure hardware controlled compensation circuit, thus increasing compensation precision and accuracy of the radio frequency module. Meanwhile, output method of RS-485 bus is employed; thereby interference among signals is eliminated due to the differential level mode employed by RS-485 bus. Moreover, module semaphore is transformed into data quantity for transmission, thus avoiding induction of outside interference signals and increasing reliability and anti-interference ability of the radio frequency module. Furthermore, as the radio frequency module employs monitoring method with above mentioned structure, tools such as computer and so on can be employed for automatically debugging and testing, thereby raising production efficiency.

BRIEF DESCRIPTION OF THE DRAWINGS

The present invention will be further described with reference to the drawings and embodiments, in the drawings.

DETAILED DESCRIPTION OF THE PREFERRED EMBODIMENT

The objective of the present invention is to provide a compensation method for radio frequency module performance, and an improved radio frequency module obtained by such method. Details of the present invention will be described with reference to the embodiments and drawings.

Figure 1:
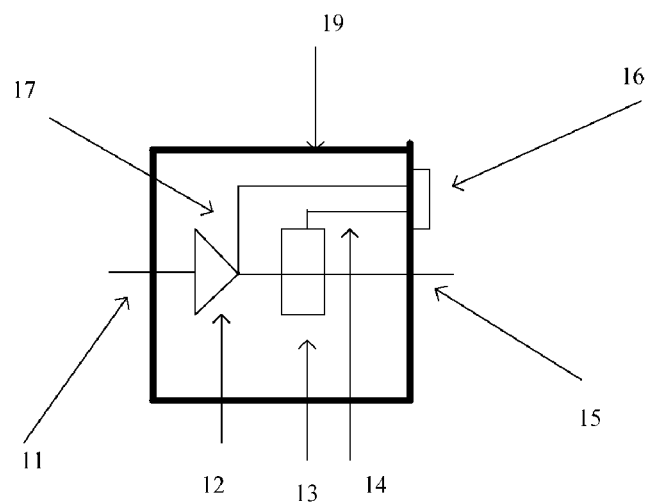
FIG. 1 is a structural diagram of currently existing radio frequency module.
Figure 2:
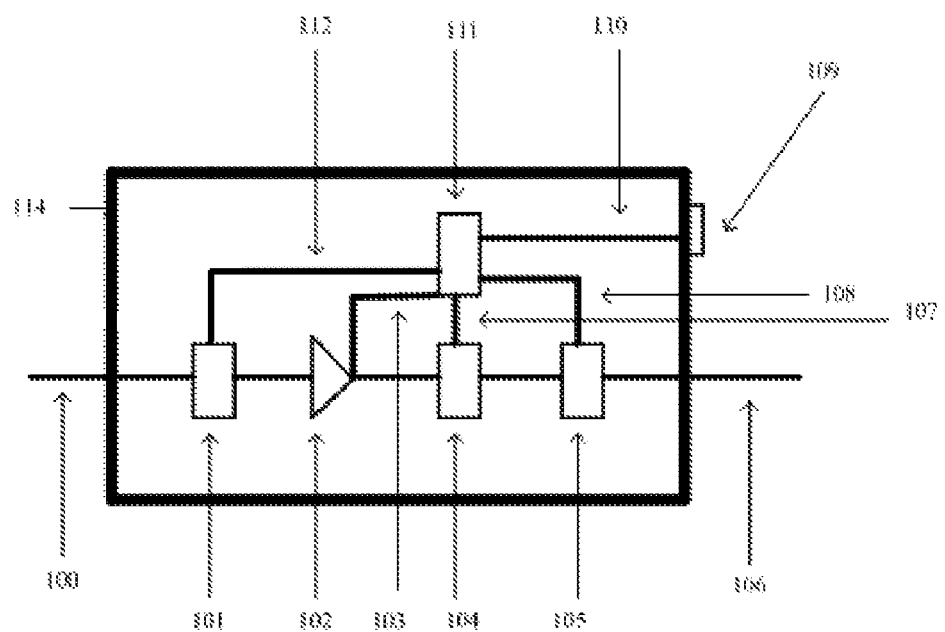
FIG. 2 is a structural diagram of radio frequency module according to the present invention.

FIG. 2 is a structural diagram of a radio frequency module improved by the present invention. As shown in FIG. 2, the shown radio frequency module comprises a radio frequency shielding housing 114. A monitoring port 109 of the radio frequency module is arranged outside the housing body of the radio frequency shielding housing 114. Inside the housing body of the radio frequency shielding housing 114, a radio frequency input power detection circuit 101, a power amplification circuit 102, a radio frequency digital controlled attenuator 104 and a radio frequency output power detection circuit 105 connected in series and in turn in a signal host link are arranged. A module monitoring circuit 111 is also arranged inside the housing body of the radio frequency shielding housing 114. Monitoring signal line 103, monitoring signal line 107, monitoring signal line 108 and monitoring signal line 112 are connected between the power amplification circuit 102 and the module monitoring circuit 111, between the module monitoring circuit 111 and the radio frequency digital controlled attenuator 104, between the module monitoring circuit 111 and the radio frequency output power detection circuit 105, and between the module monitoring circuit 111 and the radio frequency input power detection circuit 101 respectively. The module monitoring circuit 111 is connected with the monitoring port 109 through RS-485 bus 110. In module structure according to the present invention, signal of the radio frequency module is input through signal input end 100 and then output to corresponding link through signal output end 106. The radio frequency digital controlled attenuator 104 plays a role of gain attenuation in the radio frequency module (e.g. for a power amplifier module with gain of 40 dB, when it has 1 dB attenuation on the link, its gain is just 39 dB), and mainly plays a role of controlling gain of the radio frequency module herein.

Figure 3:
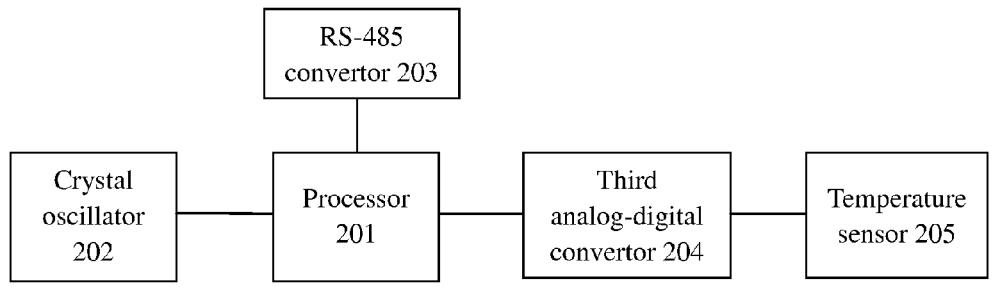
FIG. 3 is a structural diagram of module monitoring circuit of radio frequency module according to the present invention.

As shown in FIG. 3, illustrated module monitoring circuit 111 comprises a processor (i.e. CPU) 201, a crystal oscillator 202, a RS-485 convertor 203, a third analog-digital convertor 204 and a temperature sensor 205, wherein the crystal oscillator 202 is connected with reference clock pin of the processor 201, the RS-485 convertor 203 is connected with receiving/transmitting signal line of the processor 201, output part of the third analog-digital convertor 204 is connected with the processor 201, and input part of the third analog-digital convertor 204 is connected with the temperature sensor 205. The processor 201 in the module monitoring circuit 111 is connected with the temperature sensor 205, when the temperature sensor 205 works, detected internal temperature of the radio frequency module is converted to voltage value, which is sent to the third analog-digital convertor 204. After an analog-digital conversion, the voltage value is transformed into data which is sent to the processor 201 then, thus procedure of temperature collection is accomplished. According to the present invention, said processor 201 comprises components that being able to accomplish data processing (the MCU, DSP, EPGA, etc.). This embodiment takes the MCU for example.

Figure 4:
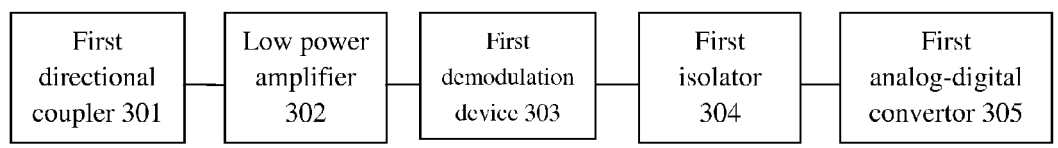
FIG. 4 is a structural diagram of radio frequency input power detection circuit of radio frequency module according to the present invention.

As shown in FIG. 4, illustrated radio frequency input power detection circuit 101 comprises a first directional coupler 301, a power amplifier 302, a first demodulation device 303, a first isolator 304 and a first analog-digital convertor 305. Wherein, main signal input end of the first directional coupler 301 is connected with input end of the radio frequency module, main signal output end of the first directional coupler 301 is connected with the power amplification circuit 102, signal end coupled from the first directional coupler 301 is connected with input end of the low power amplifier 302, output end of the low power amplifier 302 is connected with input end of the first demodulation device 303, output end of the first demodulation device 303 is connected with input end of the first analog-digital convertor 305 through the first isolator 304, output end of the first analog-digital convertor 305 is connected with the processor 201. As signal of input power is very low, therefore, the first demodulation device 303 is unable to detect power value normally, so the low power amplifier 302 is added to amplify input signal for a certain multiples, so as to enable the first demodulation device 303 to detect normally.

Figure 5:
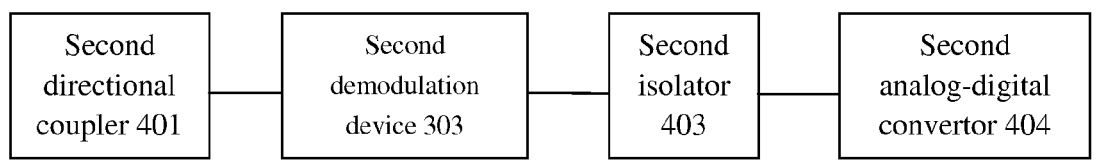
FIG. 5 is a structural diagram of radio frequency output power detection circuit of radio frequency module according to the present invention.

As shown in FIG. 5, illustrated radio frequency output power detection circuit 105 comprises a second directional coupler 401, a second demodulation device 402, a second isolator 403 and a second analog-digital convertor 404. Main signal input end of the second directional coupler 401 is connected with radio frequency digital controlled attenuator 104, main signal output end of the second directional coupler 401 is connected with output end of the radio frequency module, a certain proportion of radio frequency signal is coupled from the main signal link by the second directional coupler the coupled signal end of the second directional coupler 401 is connected with input end of the second demodulation device 402, output end of the second demodulation device 402 is connected with input end of the second analog-digital convertor 404 through the second isolator 403, output end of the second analog-digital convertor 404 is connected with the processor 201.

Furthermore, the control part of the radio frequency digital controlled attenuator 104 is connected with process 201 of the module monitoring circuit 111, signal input end of the radio frequency digital controlled attenuator 104 is connected with output end of the power amplification circuit 102, and signal output end of the radio frequency digital controlled attenuator 104 is connected with the radio frequency output power detection circuit 105. Monitoring port 109 of said radio frequency module comprises a data connector for connecting a monitoring signal of the module monitoring circuit 111 to peripheral control device of said radio frequency module, and said data connector is connected with the RS-485 bus output from the module monitoring circuit 111.

Figure 6:
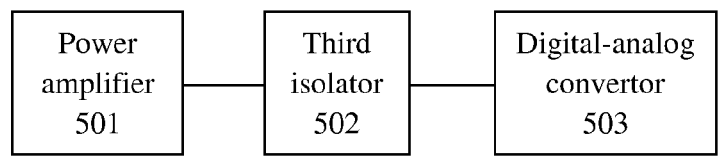
FIG. 6 is a structural diagram of power amplification circuit of radio frequency module according to the present invention.

As shown in FIG. 6, the power amplification circuit 102 comprises a power amplifier 501, a third isolator 502 and a digital-analog convertor 503. The input end of the power amplifier 501 is connected with the output end of the radio frequency input power detection circuit 101, the output end of the power amplifier 501 is connected with the input end of the radio frequency digital controlled attenuator 104, the gate of the power amplifier 501 is connected with the output part of the digital-analog convertor 503 through the third isolator 502, and the input part of the digital-analog convertor 503 is connected with the processor 201 of the module monitoring circuit 111.

When the radio frequency works, the temperature sensor 205 of the module monitoring circuit 111 collects internal temperature of the radio frequency module in real-time, and sends the collected temperature data to the MCU 201. Soft program in the MCU 201 runs to query the linearity compensation table saved in the program or to calculate based on the predefined formula/algorithm according to the collected current temperature data, and sends the compensation data obtained by querying or calculating to the data bus of the MCU 201. The digital-analog convertor 503 receives compensation data from data bus connected with the MCU 201, and converts the compensation data into a certain proportion of voltage value, which is used to control gate voltage of the power amplifier 501 in the power amplification circuit 101 through the third isolator 502, and then play a role of controlling linearity of the power amplifier 501, thereby achieve linearity adjusting of the radio frequency module, as well as reduce influence of ambient temperature to linearity of the radio frequency module. Meanwhile, when detecting radio frequency power, the soft program in the MCU 201 runs to query the power compensation table saved in the program or to calculate based on the predefined formula/algorithm according to the collected current temperature data, and corrects detected radio frequency power value by using power compensation data obtained by querying or calculating, thus reducing influence of ambient temperature to detection accuracy of the radio frequency module power.

The largest gain of the radio frequency module according to the present invention is larger than the rated gain, and the extra part is adjusted by the radio frequency digital controlled attenuator 104 according to the requirement. The term "requirement" herein refers to that the module monitoring circuit 111 will determine by comparing difference value between the radio frequency output power and the radio frequency input power detected by the radio frequency input power detection circuit 101 and the radio frequency output power detection circuit 105 with a predefined nominal value. When the actual difference value between the radio frequency output power and the radio frequency input power is larger than the nominal value, the radio frequency digital controlled attenuator 104 increases attenuation until the difference value is equal to the nominal value; contrarily, when the actual difference value between the radio frequency output power and the radio frequency input power is smaller than the nominal value, the radio frequency digital controlled attenuator 104 decreases attenuation until the difference value is equal to the nominal value.

The radio frequency module provided by the present invention mainly employs a software/hardware combination method of controllable software/hardware compensation circuit and module monitoring circuit for replacing a pure hardware controlled compensation circuit, thus increasing compensation precision and accuracy of the radio frequency module. Meanwhile, output method of RS-485 bus is employed; thereby interference among signals is eliminated due to the differential level mode employed by RS-485 bus. Moreover, module semaphore is transformed into data quantity for the transmission, thus avoiding introduction of outside interference signals and increasing reliability and anti-interference ability of the radio frequency module. Furthermore, as the radio frequency module employs monitoring method with above mentioned structure, tools such as computer and so on can be employed for automatically debugging and testing, thereby raising production efficiency.

The present invention further provides a compensation method for radio frequency module performance. FIG. 2 shows the improved radio frequency module. The radio frequency module of the present invention is provided with a radio frequency input power detection circuit 101, a power amplification circuit 102, a radio frequency digital controlled attenuator 104, a radio frequency output power detection circuit 105 and a module monitoring circuit 111. The present invention uses a software/hardware combination compensation method and replaces conventional hardware compensation circuit with the radio frequency digital controlled attenuator 104.

Wherein, soft program running in the processor of the module monitoring circuit 111 queries the predefined power compensation table or calculates based on the predefined formula/algorithm according to collected temperature data to obtain a power compensation value, which is used to correct the detected radio frequency power value, thus reducing influence of ambient temperature to power detection accuracy of the radio frequency module. However, when the radio frequency signals with same size are detected under different temperatures, the detected results may be different from the actual value. Therefore, it is necessary to correct the detected results with the actual value and make a table of compensation values at each temperature. This way, compensation value corresponding to currently detected temperature can be queried and then be directly added to the detected result. When power value of the radio frequency is read by external, the read value will directly be a corrected result.

Meanwhile, the program running in the processor of said module monitoring circuit 111 compares difference value between radio frequency output power and radio frequency input power with a pre-saved gain value according to the collected radio frequency output power value and radio frequency input power value, and then sends compensation data obtained by the comparison to the radio frequency digital controlled attenuator 104 through a monitoring signal line 107. The radio frequency digital controlled attenuator 104 plays a role of varying signal intensity of the host link, so as to reduce influence of ambient temperature to gain of the radio frequency module. Wherein, when the actual difference value between radio frequency output power and radio frequency input power is larger than the predefined nominal value, the radio frequency digital controlled attenuator 104 increases attenuation until the difference value is equal to the nominal value; contrarily, when the actual difference value between radio frequency output power and radio frequency input power is smaller than the predefined nominal value, the radio frequency digital controlled attenuator 104 decreases attenuation until the difference value is equal to the nominal value.

Meanwhile, soft program running in the processor 201 of the module monitoring circuit 111 queries the predefined power compensation table or calculates based on the predefined formula/algorithm according to collected temperature data to obtain a compensation value, which is used to adjust voltage value of the third analog-digital convertor 204, thus adjusting linearity of the radio frequency module and reducing influence of ambient temperature to linearity of the radio frequency module. Wherein, linearity corresponding to each temperature value may be different from each other, accordingly the device should be tested under a certain condition. Above-mentioned the power compensation table is linearity needed to be detected through actual temperature, and adjustment of linearity is achieved by controlling gate voltage of power amplification tube of the power amplifier in the power amplification circuit 102. Moreover, said formula/algorithm actually refers to a formula or an algorithm being able to realize functions of the above-mentioned table. Actually same function has been realized by the formula/algorithm and the above-mentioned table, that is, correspond each temperature to one linearity.

According to the present invention, said processor (i.e. MCU) further comprises components that being able to achieve data processing, such as MCU, DSP, FPGA etc. The present invention takes MCU for example. The linearity compensation table and the power compensation table predefined in the program are discrete tables formed by emulating or actually measuring and calculating according to theoretical temperature characteristic curves of components such as the power amplifier of the power amplification circuit 102, the radio frequency demodulation tube of the radio frequency input/output power detection circuit 101/106 etc. The linearity compensation formula/algorithm and the power compensation table formula/algorithm used in the program are concluded by emulating or actually measuring and calculating according to theoretical temperature characteristic curves of components such as the power amplifier of the power amplification circuit 102, the radio frequency demodulation tube of radio frequency input/output power detection circuit 101/106 etc.

Figure 7:
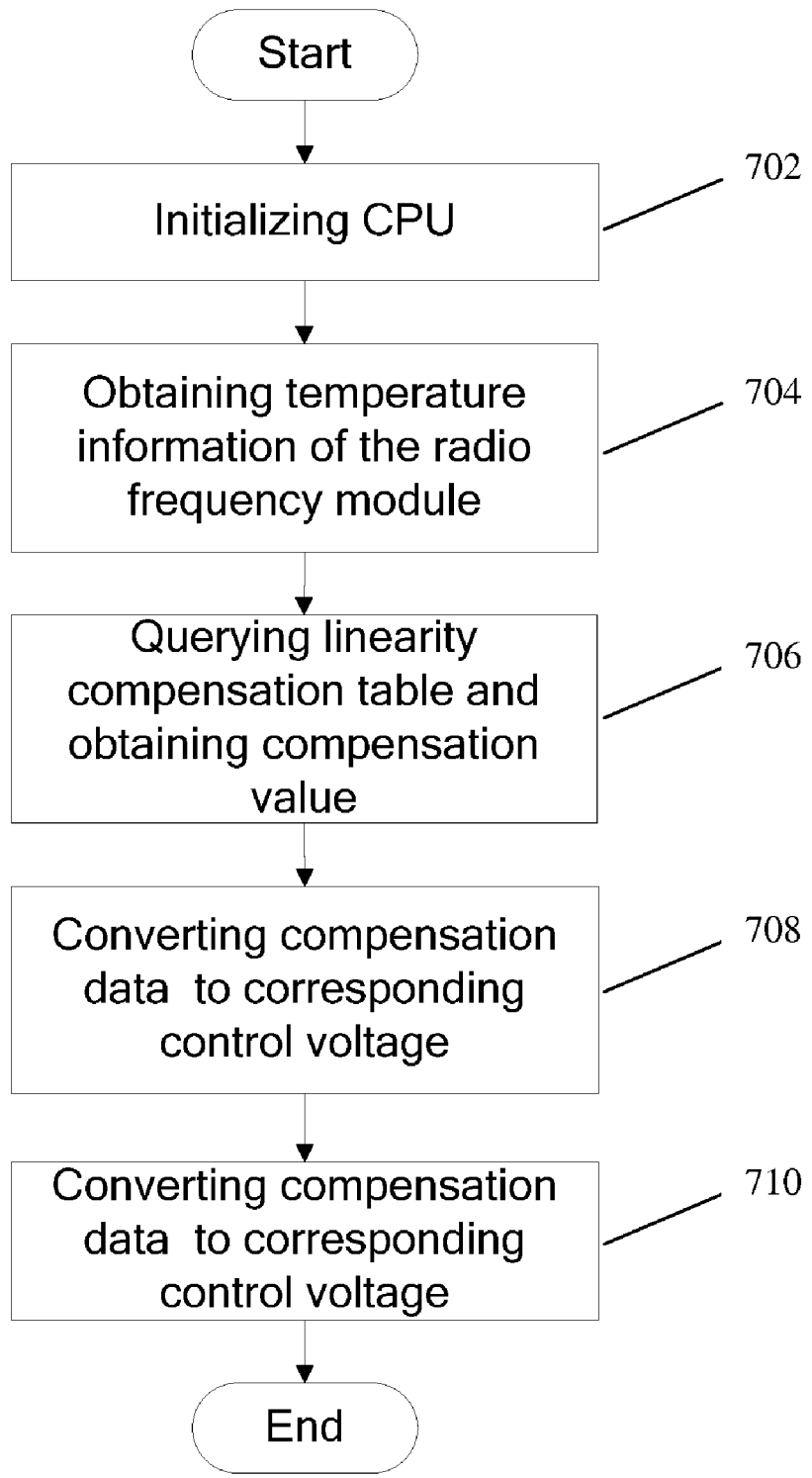
FIG. 7 is a method flow chart of querying the linearity compensation table in compensation method according to the present invention.

FIG. 7 is a method flow chart of querying the linearity compensation table in compensation method according to the present invention. In the step 702, when the radio frequency module starts up, pre-installed program in the processor 201 of the module monitoring circuit 111 runs all the initial values. Wherein, initial values mainly comprises necessary data while the program runs, loading rated gain value of the radio frequency module, linearity compensation value, power detection corrected value etc. In the step 704, the processor 201 runs the program, the temperature sensor 205 detects internal temperature of the radio frequency module in real-time to obtain a current temperature value. In the step 706, corresponding corrected value is obtained by querying the linearity compensation table pre-saved in the program or calculating based on the formula/algorithm saved in the program according to the temperature value obtained in the step 205. In the step 708, the obtained compensation value is outputted to the third analog-digital convertor 204 and is converted into a corresponding voltage value. In the step 710, the voltage value obtained in the step 708 is sent to the gate of the radio frequency power amplifier of the power amplification circuit 102, so as to adjust linearity of the radio frequency module.

Figure 8:
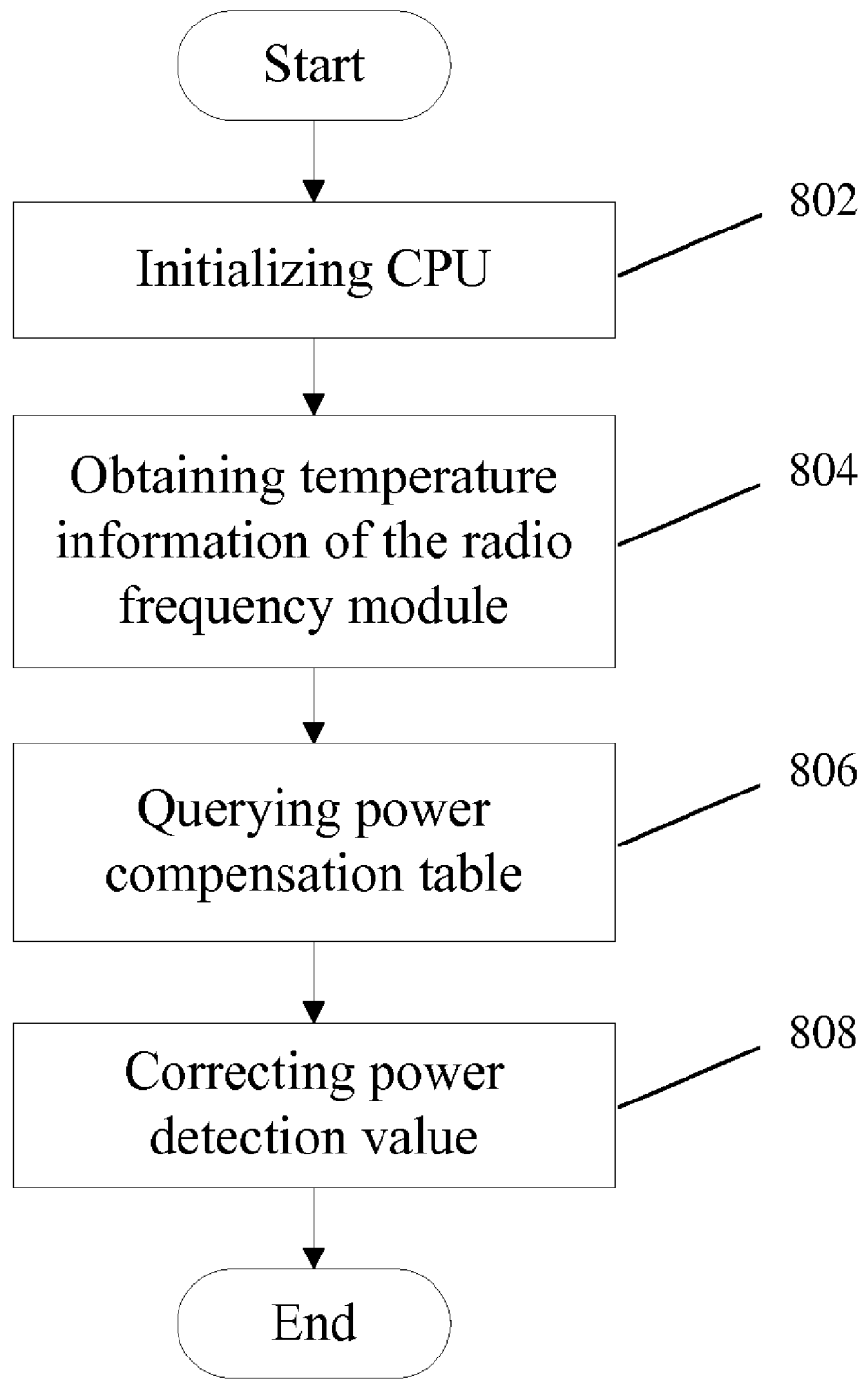
FIG. 8 is a method flow chart of correcting power detection value in compensation method according to the present invention.

FIG. 8 is a method flow chart of correcting power detection value in compensation method according to the present invention. In the step 802, when the radio frequency module starts up, pre-installed program in the process 201 of the module monitoring circuit 111 runs all the initial values. In the step 804, the processor 201 runs the program, the temperature sensor 205 detects internal temperature of the radio frequency module in real-time and obtains a current temperature value. In the step 806, corresponding power compensation value is obtained by querying the power compensation table pre-saved in the program or calculating based on the formula/algorithm saved in the program according to the temperature value obtained in the step 804. In the step 808, the obtained power compensation value is added to the currently detected power detection value, so as to obtain a corrected power detection value.

Figure 9:
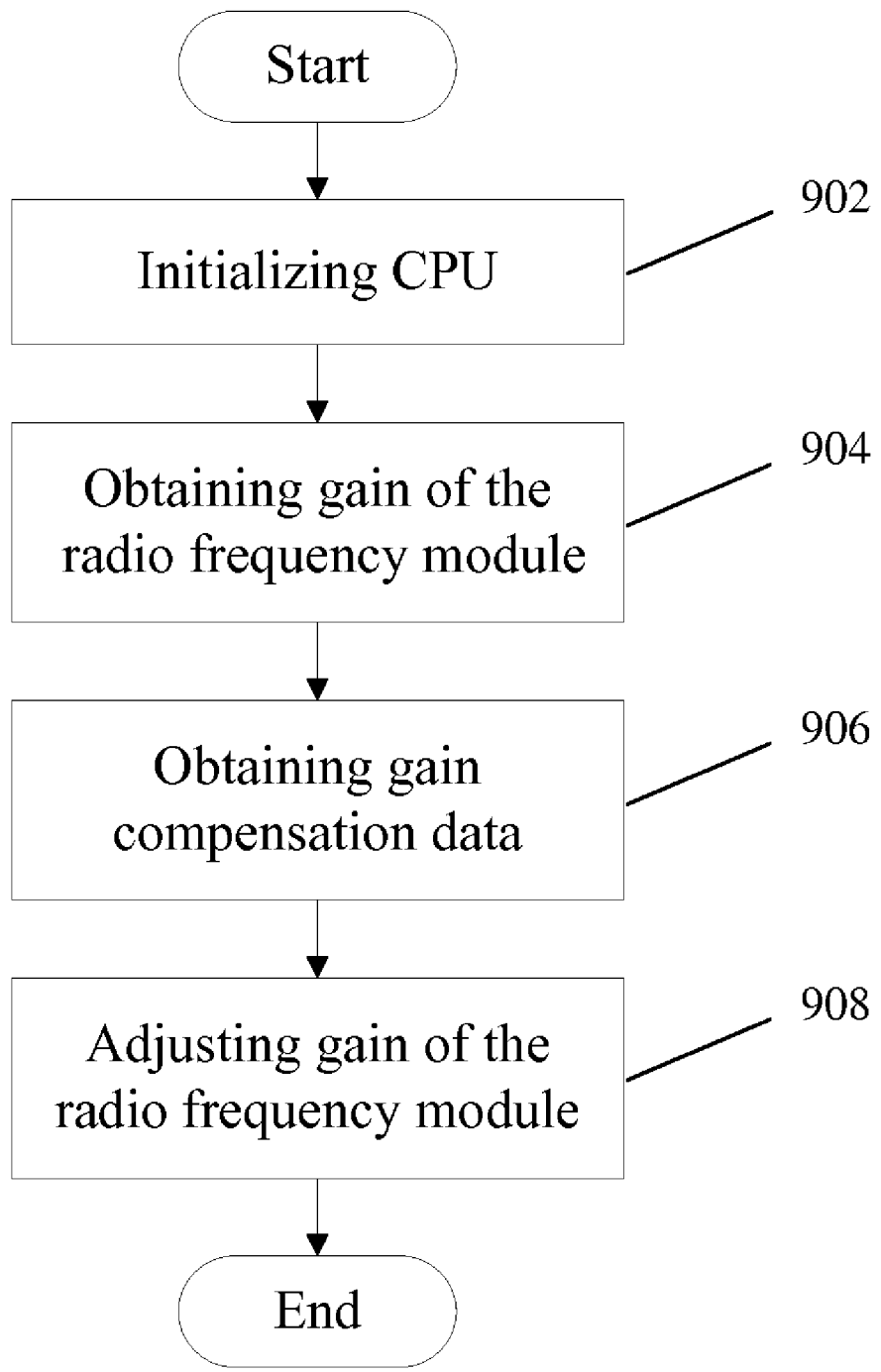
FIG. 9 is a method flow chart of querying the gain compensation table in compensation method according to the present invention.

FIG. 9 is a method flow chart of querying the gain compensation table in compensation method according to the present invention. In the step 902, after the radio frequency module starts up, pre-installed program in the process 201 of the module monitoring circuit 111 runs all the initial values. In the step 904, the processor 201 runs the program, detects radio frequency output power and radio frequency input power of the radio frequency module via the radio frequency input power detection circuit 101 and the radio frequency output power detection circuit 106 in real-time, and calculates difference value of the radio frequency output power and the radio frequency input power, the calculated difference value is the gain of the radio frequency module. In the step 906, the obtained gain value is compared with the rated gain value pre-saved in the program, and the obtained difference value is a corresponding gain compensation data. In the step 908, the obtained gain compensation data is outputted to the radio frequency digital controlled attenuator 104, so as to adjust gain of the radio frequency module.

The compensation method for radio frequency module performance provided by the present invention employs a software/hardware combination method for replacing a pure hardware method, and intelligently compensates the radio frequency module using the data obtained by predefined compensation table or formula/algorithm, thus being able to adjust each characteristic of the device accurately and easily, so as to improve performance of the radio frequency module and further meet the need of working stability of the radio frequency module. By employing a software/hardware combination method of controllable software/hardware compensation circuit and module monitoring circuit for replacing a pure hardware controlled compensation circuit in prior art, the precision and accuracy of compensation for the radio frequency module is improved, and the precision can be controlled within ±1.0 dB and even smaller. Moreover, since the radio frequency module is able to be automatically debugged and tested by tools such as computer, production efficiency will be improved.

The foregoing description are just preferred embodiments for methods and devices according to the present invention and are described specifically and in detail, but cannot be understood as limitation to scope of the present invention. It should be indicated that one skilled in the art can make various modifications and equivalent variations to embodiments according to content disclosed above within scope of the present invention and without departing from spirit of the present invention, all these modifications and equivalent transformations are part of protection range of the present invention.

We claim:

1. A compensation method for radio frequency module performance, wherein said radio frequency module is provided with a radio frequency input power detection circuit (101), a power amplification circuit (102), a radio frequency digital controlled attenuator (104), a radio frequency output power detection circuit (105) and a module monitoring circuit (111), said method comprises:
   S1: Said module monitoring circuit (111) queries a predefined linearity compensation table or calculates based on a predefined formula/algorithm according to collected temperature data to obtain a linearity compensation data, which is sent to said power amplification circuit (102) after being converted into corresponding control voltage by digital-analog conversion, so as to control linearity of said radio frequency module;
   S2: Said module monitoring circuit (111) queries a predefined power compensation table or calculates based on a predefined formula/algorithm according to collected temperature data to obtain a power compensation value, which is added to currently detected power detection value, so as to obtain corrected power detection value;
   S3: The module monitoring circuit (111) compares difference value between radio frequency output power and radio frequency input power with a pre-saved gain value according to the collected radio frequency output power value and radio frequency input power value, so as to adjust said radio frequency digital controlled attenuator (104) based on the comparison result.

2. The compensation method for radio frequency module performance according to claim 1, wherein said step S1 further comprises:
   S11: After said radio frequency module starts up, a pre-installed program in the processor (201) of said module monitoring circuit (111) runs all the initial values;
   S12: Said processor (201) runs the program, the temperature sensor (205) detects internal temperature of said radio frequency module in real-time and the processor (201) obtains current temperature;
   S13: According to the obtained temperature, queries the linearity compensation table pre-saved in the program or calculates based on the formula/algorithm saved in the program, and obtains corresponding compensation value;
   S14: Outputs the obtained compensation value to a digital-analog convertor (503) of power amplification circuit (102), and converts the compensation value to corresponding voltage value;
   S15: Sends the obtained voltage value to the gate of a radio frequency power amplifier (501) of said power amplification circuit (102), so as to adjust linearity of said radio frequency module.

3. The compensation method for radio frequency module performance according to claim 1, wherein said step S2 further comprises:

S21: After said radio frequency module starts up, a pre-installed program in the processor (201) of said module monitoring circuit runs all the initial values;
   S22: Said processor (201) runs the program, the temperature sensor (205) detects internal temperature of said radio frequency module in real-time and obtains current temperature;
   S23: According to the obtained temperature, queries the power compensation table pre-saved in the program or calculates based on the formula/algorithm saved in the program, and obtains corresponding power compensation value;
   S24: Adds the obtained power compensation value to currently detected power detection value, so as to obtain corrected power detection value.

4. The compensation method for radio frequency module performance according to claim 1, wherein said step S3 further comprises:
   S31: After said radio frequency module starts up, pre-installed program in the processor (201) of said module monitoring circuit (111) runs all the initial values;
   S32: Said processor (201) runs program, detects radio frequency output power and radio frequency input power of said radio frequency module in real-time through the radio frequency output power detection circuit (105) and the radio frequency input power detection circuit (101), and calculates difference value of radio frequency output power and radio frequency input power, the calculated difference value is gain of the radio frequency module;
   S33: Compares the obtained gain value with gain value pre-saved in the program, obtained difference value is corresponding gain compensation data;
   D34: Outputs the obtained gain compensation data to radio frequency digital controlled attenuator (104), so as to adjust gain of said radio frequency module.

5. A radio frequency module, comprising a radio frequency shielding housing (114); a power amplification circuit (102) and a compensation circuit connected in series and in turn in a signal host link are arranged inside said radio frequency shielding housing (114), a monitoring port (109) of said radio frequency module is arranged outside said radio frequency shielding housing (114), wherein said compensation circuit comprises a radio frequency digital controlled attenuator (104); a module monitoring circuit (111), as well as a radio frequency input power detection circuit (101) and a radio frequency output power detection circuit (105) connected in series and in turn with said power amplification circuit (102) and radio frequency digital controlled attenuator (104) in a signal host link are also arranged inside said radio frequency shielding housing (114); said module monitoring circuit (111) is connected with the radio frequency input power detection circuit (101), the power amplification circuit (102), the radio frequency digital controlled attenuator (104) and the radio frequency output power detection circuit (105) respectively through monitoring signal lines; the module monitoring circuit (111) also is connected with the monitoring port (109) through a RS-485 bus (110).

6. The radio frequency module according to claim 5, wherein said module monitoring circuit (111) comprises a processor (201), a crystal oscillator (202), a RS-485 convertor (203), a third analog-digital convertor (204) and a temperature sensor (205), wherein said crystal oscillator (202) is connected with reference clock pin of the processor (201), said RS-485 convertor (203) is connected with receiving/transmitting signal line of the processor (201), output part of the third analog-digital convertor (204) is connected with the processor (201), and input part of the third analog-digital convertor (204) is connected with the temperature sensor (205).

7. The radio frequency module according to claim 6, wherein said radio frequency input power detection circuit (101) comprises a first directional coupler (301), a low power amplifier (302), a first demodulation device (303), a first isolator (304) and a first analog-digital convertor (305), wherein main signal input end of said first directional coupler (301) is connected with input end of the radio frequency module, main signal output end of the first directional coupler (301) is connected with the power amplification circuit (102), a signal end coupled from the first directional coupler (301) is connected with input end of the low power amplifier (302), output end of the low power amplifier (302) is connected with input end of the first demodulation device (303), output end of the first demodulation device (303) is connected with input end of the first analog-digital convertor (305) through the first isolator (304), output end of the first analog-digital convertor (305) is connected with the processor (201).

8. The radio frequency module according to claim 7, wherein said radio frequency output power detection circuit (105) comprises a second directional coupler (401), a second demodulation device (402), a second isolator (403) and a second analog-digital convertor (404), wherein main signal input end of the second directional coupler (401) is connected with radio frequency digital controlled attenuator (104), main signal output end of the second directional coupler (401) is connected with output end of the radio frequency module, a certain proportion of radio frequency signal is coupled from the main signal link by the second directional coupler, coupled signal end of the second directional coupler (401) is connected with input end of the second demodulation device (402), output end of the second demodulation device (402) is connected with input end of the second analog-digital convertor (404) through the second isolator (403), output end of the second analog-digital convertor (404) is connected with the processor (201).

9. The radio frequency module according to claim 6, wherein said radio frequency output power detection circuit (105) comprises a second directional coupler (401), a second demodulation device (402), a second isolator (403) and a second analog-digital convertor (404), wherein main signal input end of the second directional coupler (401) is connected with radio frequency digital controlled attenuator (104), main signal output end of the second directional coupler (401) is connected with output end of the radio frequency module, a certain proportion of radio frequency signal is coupled from the main signal link by the second directional coupler, coupled signal end of the second directional coupler (401) is connected with input end of the second demodulation device (402), output end of the second demodulation device (402) is connected with input end of the second analog-digital convertor (404) through the second isolator (403), output end of the second analog-digital convertor (404) is connected with the processor (201).

10. The radio frequency module according to claim 6, wherein control part of said radio frequency digital controlled attenuator (104) is connected with the processor (201) of the module monitoring circuit (111), signal input end of the radio frequency digital controlled attenuator (104) is connected with output end of the power amplification circuit (102), and signal output end of the radio frequency digital controlled attenuator (104) is connected with the radio frequency output power detection circuit (105).

11. The radio frequency module according to claim 5, wherein monitoring port (109) of the said radio frequency module comprises a data connector for connecting monitoring signal of the module monitoring circuit (111) to peripheral control device of said radio frequency module, and said data connector is connected with RS-485 bus outputted from the module monitoring circuit (111).

\* \* \* \* \*